US010573500B2

(12) United States Patent
Foo et al.

(10) Patent No.: US 10,573,500 B2
(45) Date of Patent: *Feb. 25, 2020

(54) INTERCHANGEABLE MAGNET PACK

(71) Applicant: Seagate Technology LLC, Cupertino, CA (US)

(72) Inventors: Toon Hai Foo, Singapore (SG); Thomas P. Nolan, Fremont, CA (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 109 days.

This patent is subject to a terminal disclaimer.

(21) Appl. No.: 15/046,340

(22) Filed: Feb. 17, 2016

(65) Prior Publication Data

US 2016/0163521 A1 Jun. 9, 2016

Related U.S. Application Data

(63) Continuation-in-part of application No. 13/316,358, filed on Dec. 9, 2011, now Pat. No. 9,347,129.

(51) Int. Cl.
H01J 37/34 (2006.01)
C23C 14/34 (2006.01)
C23C 14/35 (2006.01)
H01F 7/02 (2006.01)

(52) U.S. Cl.
CPC ...... *H01J 37/3455* (2013.01); *C23C 14/3407* (2013.01); *C23C 14/35* (2013.01); *H01F 7/0284* (2013.01); *H01J 37/3408* (2013.01); *H01J 37/3452* (2013.01); *H01J 37/3482* (2013.01); *H01J 2237/152* (2013.01); *H01J 2237/3323* (2013.01); *Y10T 29/49826* (2015.01); *Y10T 29/49947* (2015.01)

(58) Field of Classification Search
CPC . C23C 14/3407; H01J 37/3452; H01J 37/345; H01J 37/3455; H01J 37/3405; H01J 37/3408
USPC .......................................... 204/298.19, 298.2
See application file for complete search history.

(56) References Cited

U.S. PATENT DOCUMENTS

| 3,386,568 A | 6/1968 | Harmon |
| 4,810,346 A | 3/1989 | Wolf et al. |
| 5,181,020 A | 1/1993 | Furukawa et al. |
| 5,407,551 A | 4/1995 | Sieck et al. |
| 6,132,576 A | 10/2000 | Pearson |

(Continued)

FOREIGN PATENT DOCUMENTS

| EP | 1875484 A1 | 1/2008 |
| JP | H10-121236 A | 5/1998 |

(Continued)

OTHER PUBLICATIONS

Extended European Search Report dated Jul. 27, 2015 in EP Application No. 12856309.5. 8 pages.

(Continued)

*Primary Examiner* — Rodney G McDonald
(74) *Attorney, Agent, or Firm* — Holzer Patel Drennan

(57) ABSTRACT

An apparatus includes a target, wherein the target includes a nonuniform erosion profile. The apparatus also includes a number of interchangeable magnetic and non-magnetic inserts. The interchangeable magnetic and non-magnetic inserts are configured to control a pass through flux based on the nonuniform erosion profile.

14 Claims, 8 Drawing Sheets

(56) References Cited

U.S. PATENT DOCUMENTS

| | | |
|---|---|---|
| 6,287,435 B1 | 9/2001 | Drewery et al. |
| 6,719,886 B2 | 4/2004 | Drewery et al. |
| 7,183,766 B2 | 2/2007 | Ito et al. |
| 2001/0009224 A1 | 7/2001 | Han et al. |
| 2001/0045353 A1 | 11/2001 | Hieronymi et al. |
| 2002/0148725 A1 | 10/2002 | Subramani et al. |
| 2005/0051424 A1 | 3/2005 | Fu et al. |
| 2005/0211548 A1 | 9/2005 | Gung et al. |
| 2007/0108041 A1 | 5/2007 | Guo |
| 2010/0101602 A1 | 4/2010 | Deehan et al. |
| 2010/0252427 A1 | 10/2010 | Pei |
| 2011/0056829 A1 | 3/2011 | Morimoto et al. |
| 2012/0097534 A1 | 4/2012 | Takahashi et al. |
| 2013/0146453 A1* | 6/2013 | Foo .................... C23C 14/3407 204/298.17 |

FOREIGN PATENT DOCUMENTS

| | | |
|---|---|---|
| JP | 2001-515966 A | 9/2001 |
| JP | 2007-530787 A | 11/2007 |
| JP | WO2010-023952 A1 | 3/2010 |
| JP | 4924835 B2 | 4/2012 |
| KR | 10-2007-0102497 A | 10/2007 |
| WO | 2006-114299 A1 | 11/2006 |

OTHER PUBLICATIONS

PCT International Search Report and Written Opinion dated Mar. 21, 2013 in International Application No. PCT/US2012/068635. 9 pages.
PCT International Preliminary Report on Patentability dated Jun. 19, 2014 in International Application No. PCT/US2012/068635. 6 pages.
SG Search Report and Written Opinion dated Jul. 3, 2015 in SG Application No. 11201403053U. 19 pages.

* cited by examiner

600

```
┌─────────────────────────────────┐
│ Configure a number of magnetic  │
│ inserts to control a pass       │
│ through flux of a target        │
│ based on a nonuniform erosion   │
│ profile of the target           │
│ 602                             │
└─────────────────────────────────┘
              │
              ▼
┌─────────────────────────────────┐
│ Configure a number of non-      │
│ magnetic inserts to control     │
│ the pass through flux of the    │
│ target based on the nonuniform  │
│ erosion profile of the target   │
│ 604                             │
└─────────────────────────────────┘
              │
              ▼
┌─────────────────────────────────┐
│ Reconfigure the number of       │
│ magnetic inserts to control     │
│ the pass through flux of the    │
│ target based on a change to     │
│ the nonuniform erosion profile  │
│ of the target                   │
│ 606                             │
└─────────────────────────────────┘
              │
              ▼
┌─────────────────────────────────┐
│ Reconfigure the number of non-  │
│ magnetic inserts to control     │
│ the pass through flux of the    │
│ target based on the change      │
│ to the nonuniform erosion       │
│ profile of the target           │
│ 608                             │
└─────────────────────────────────┘
```

FIG. 6

INTERCHANGEABLE MAGNET PACK

CROSS-REFERENCE

This application is a continuation-in-part of U.S. application Ser. No. 13/316,358 filed on Dec. 9, 2011.

BACKGROUND

Generally, sputtering is a process carried out in a vacuum chamber that is filled with selected gasses. The sputtering process causes a substrate to be coated with a material from a target located within a sputtering chamber. Electrons in the chamber strike and ionize an inert gas, forming positive ions. The positive ions are then attracted to the negative target. When the ions strike the target, the ions transfer energy to the target material, causing material from the target to eject. Some of the ejected material adheres to and coats the substrate.

SUMMARY

Provided herein is an apparatus that includes a target, wherein the target includes a nonuniform erosion profile. The apparatus also includes a number of interchangeable magnetic and non-magnetic inserts. The interchangeable magnetic and non-magnetic inserts are configured to control a pass through flux based on the nonuniform erosion profile. These and various other features and advantages will be apparent from a reading of the following detailed description.

DRAWINGS

FIG. 6 depicts a flowchart of an exemplary process of controlling a sputtering process by optimizing the positions and arrangements of magnetic and non-magnetic inserts within a magnet pack, according to one aspect of the present description.

DESCRIPTION

Figure 1A:
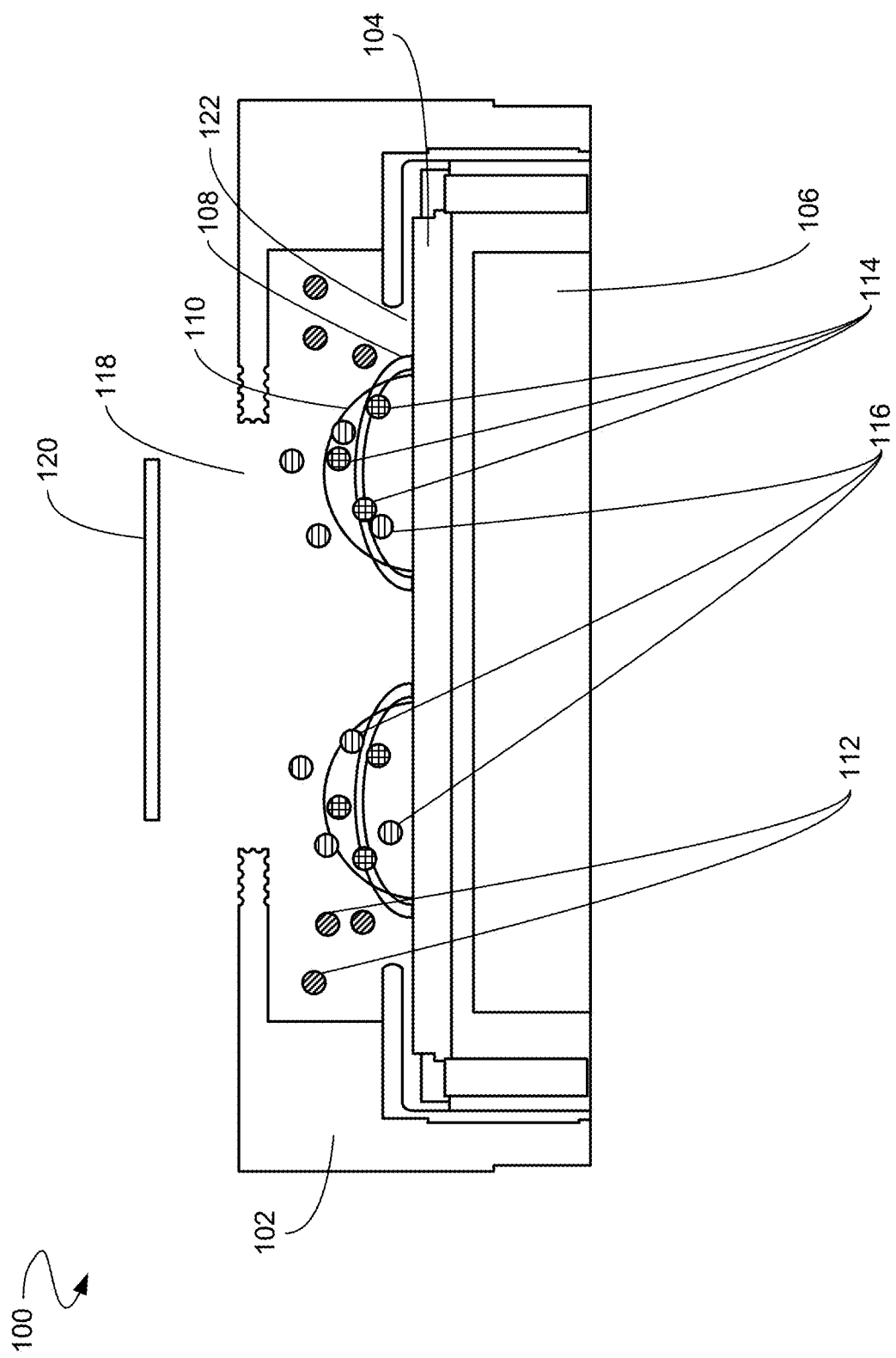
FIG. 1A is a cross section of a sputtering apparatus with a programmable magnet pack, according to one aspect of the present description.

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized that the embodiments may be practiced without these specific details. In other instances, well-known methods, procedures, components, and circuits have not been described in detail as not to unnecessarily obscure aspects of the embodiments.

Embodiments of the present invention relate to a programmable magnet pack for use in sputtering. The programmable magnet pack includes a cover, a yoke, and a template having a number of cells. A number of removable magnetic inserts and a number of removable non-magnetic inserts are disposed within the cells on the template. The removable inserts may be rearranged to customize or shape magnetic field profiles emanating from the magnet pack. Thus the magnetic fields may be modified to alter sputtering characteristics. The magnetic field may thereby be adjusted to optimize sputtering from different target materials, using shields and chosen hardware geometries that are desired for different applications. The yoke provides a return path for the magnetic field generated by the arrangement of inserts disposed into the template. The cover protects the various inserts disposed within the cells of the template from damage and also allows for the inserts to come as close as possible to a sputtering target. The cells and inserts may be fashioned in any shape.

The ability of a magnetic field emanating from a magnet behind a target to shape the plasma that controls the erosion profile and redeposition of a sputter target is limited by the amount of magnetic flux that is able to pass through the target. Pass through flux ("PTF") of a target is commonly quoted as a percentage of flux strength that passes through the target under a uniform testing condition. Pass through flux of a target decreases with increasing thickness of the target. Pass through flux is generally inversely related to the magnetic moment of the target material. Pass through flux is also affected by the magnetic permeability of the target material.

Thus, a much stronger back-side magnet is generally required to control the plasma deposition of a high moment magnetic material of the recording layer or SUL as compared to a non-magnetic seed layer or interlayer. Furthermore, the high permeability of a magnetic material can redirect the flux flow and broaden or otherwise change the shape of the flux profile emanating from the front (plasma) side of the target as compared to that entering the back (magnet) side of the target.

As material is sputtered from a magnetic target, the target is eroded and becomes thinner. Correspondingly, there is less material affecting the flux passing through the target. The PTF correspondingly increases and the broadening of the magnetic flux may be reduced. Also correspondingly, the magnetic field affecting the plasma confinement is changed and the sputter profile of the target changes. For a case where the target erosion profile was initially optimized for factors such as maximum target utilization, deposition thickness uniformity on the substrate, and target redeposition minimization, the profile changes as the target erodes will deoptimize those properties.

To compensate for the overall increase in magnetic field penetrating through the target to the plasma, it may be desirable to correspondingly decrease the magnetic field emanating from the back-side magnet so as to maintain a more constant magnetic field at the plasma that defines the target erosion profile. Similarly, one can pull the magnet away from the back of the target to effectively thicken the target spacing (e.g. change the "z-position").

However, in an effort to make uniform deposition thickness on a substrate using a finite sized, shielded target, it is geometrically necessary to sputter more material from the radial band of target larger than the substrate diameter, as compared to the amount of material sputtered from the center of the target. Correspondingly, this band of the target erodes faster than other locations. As it erodes, the flux in that region increases and becomes less spread out, forming an increasingly deep and narrow trench in the target. If the magnet is simply pulled away from the target, the PTF in that band can be maintained as it erodes, but other bands with less erosion become deoptimized and sputter too slowly, resulting in redeposition, poor target utilization, sputter thickness nonuniformity, and related issues.

To reduce this trenching while maintaining the sputter uniformity and avoiding redeposition, the magnetic field emanating from the target may be lowered more rapidly in the erosion trench area. This serves to maintain a broad shallow trench that increases utilization and maintains a more constant magnetic field profile defining the plasma at the front side of the target. This maintains sputter thickness uniformity, increases the target's useful lifetime, and reduces redeposition throughout the target's life.

The programmable mag pack enables, for example, reduction of the magnetic moment or removal of magnetic inserts of cells only at the radius of the developing trench. In another embodiment, the z-position of magnetic cells could be increased only in the region of the trenching. Several advantages of the programmable designs are that the trenching occurs at different rates and radii depending on the PTF and magnet strength, so that the programmed magnetic settings may be tuned to each target material's magnetic properties. Thus, each new material does not require a new mag pack. Different shield openings (e.g. apertures) different target to substrate spacings, different chamber gas pressures, and different sputter powers change the sputter radial thickness profile, and magnets do not need to be designed for each process change. Different disk sizes (eg +1.8" vs ~2.5" vs ~3.5", etc.) have good utilization and uniformity with trenching at different radii. In various embodiments, the trench generally may be at larger radius to increase uniformity of disks, especially the larger (e.g. 3.5") disks.

FIG. 1A is a cross section of an exemplary sputtering apparatus 100 with a programmable magnet pack 106, according to an embodiment of the present invention. In some embodiments, a shield 102 may direct the flow of gas over the surface of a target 104. In various embodiments the shield 102 may be a redeposition shield, which reduces material redepositing back onto the surface of the target 104.

The target 104 overlies the programmable magnet pack 106. The programmable magnet pack 106 creates magnetic fields 108 overlying the target 104 and emanating from a number of cells 208 (see FIG. 2). Plasma 110 is confined by the magnetic fields 108. Electrons 112 strike atoms within the plasma 110, forming ions 114. In an embodiment, the ions 114 may comprise positively charged ions. In embodiments of the present invention, the programmable magnet pack 106 may be configured (see below) to customize or shape the magnetic fields 108 into predetermined and desired forms. In further embodiments, the spacing between the target 104 and the programmable magnet pack 106 may be adjustable (e.g. the z-height may be selected). As a result, the sputtering characteristics of the sputtering apparatus 100 may be selectively altered.

The positive ions 114 are attracted towards the negatively biased target 104. The ions 114 strike the surface of the target 104, releasing target material 116 from the target 104. The shield 102 directs the target material 116 through an aperture 118 (e.g. shield opening) and onto a substrate 120. In various embodiments, a reactive gas (not shown), e.g. oxygen, is added within the sputtering apparatus 100. The reactive gas may combine with the target material 116 before collecting on the substrate 120. The target material 116 collects on the substrate 120, forming a thin film (not shown). Thus, the substrate 120 overlies the aperture 118. In some embodiments, the diameter of target 104 is greater than the diameter of the aperture 118, and the diameter of aperture 118 is greater than or equal to the diameter of the substrate 120.

Figure 1B:
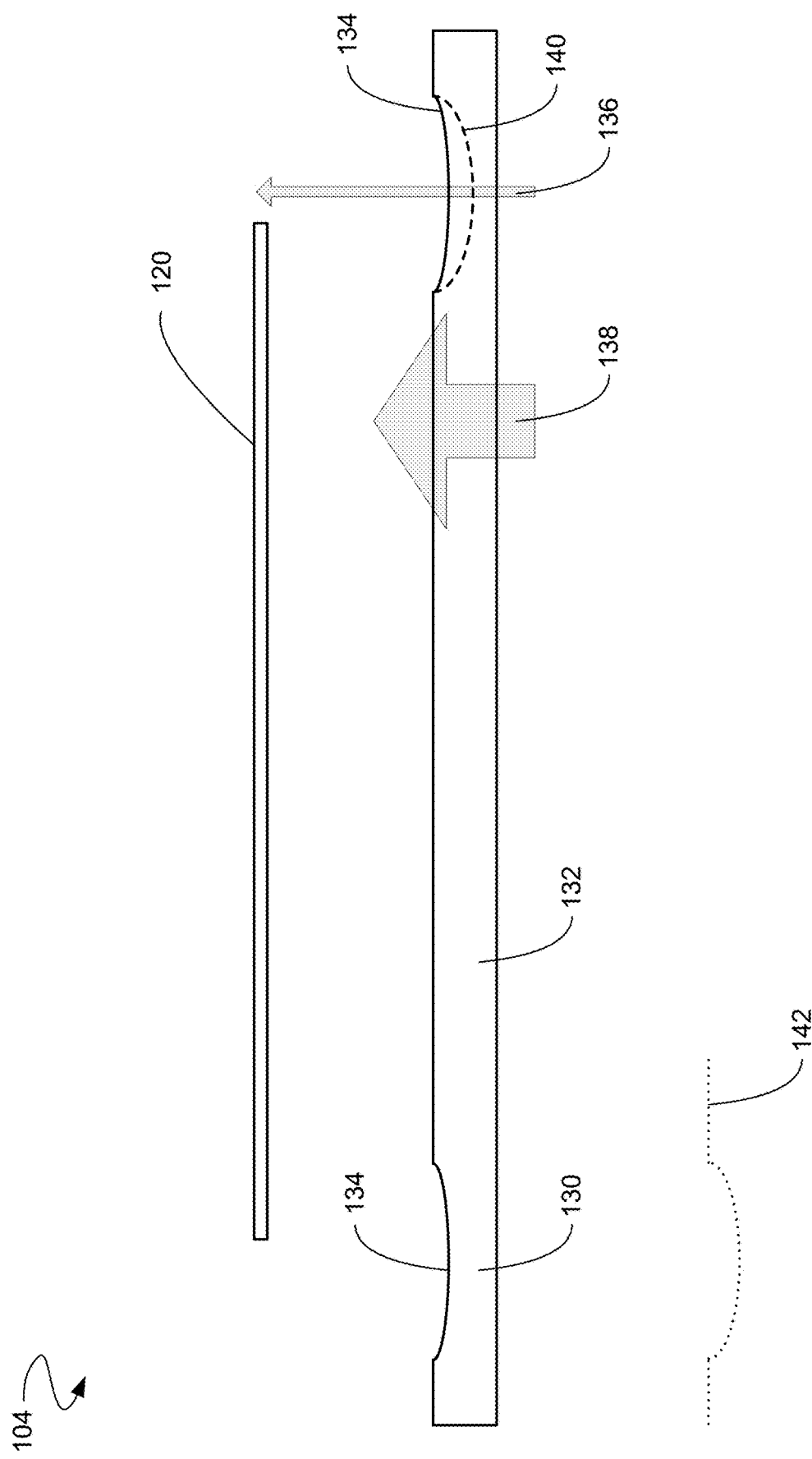
FIG. 1B is an enlarged cross section of the target and the substrate, illustrating a simplified exemplary erosion profile, according to one aspect of the present description.

FIG. 1B is an enlarged cross section of the target 104 and the substrate 120, illustrating a simplified exemplary erosion profile. As material is sputtered from the target 104, the target is eroded and becomes thinner. In various embodiments, in order to deposit a uniform thickness on a workpiece (e.g. substrate 120), more material is sputtered from an outer diameter 130 of the target 104 than from an inner diameter 132 of the target 104. As a result a radial band (e.g. trench 134) at an outer diameter of the target erodes faster than other locations, such as the center of the target. The illustration of substrate 120 FIG. 1B is merely exemplary, and it is understood that various embodiments may include a substrate with smaller or larger diameters with respect to the trench 134 and the target 104.

As erosion continues, a pass through flux becomes stronger in areas of greater erosion than areas of lesser erosion. For example, a pass through flux 136 in the area of the trench 134 is stronger than a pass through flux 138 in an inner diameter of the target 104. As a result of the stronger and pass through flux 136, the area of the trench 134 erodes faster than other locations (e.g. the area of the weaker pass through flux 138). As the erosion continues, the flux in that region continues to increase and becomes less spread out, forming an increasingly deep and narrow trench 140. The deep and narrow trench 140 deoptimizes factors such as maximum target utilization, deposition thickness and uniformity on the substrate, and target redeposition minimization.

To control the size of the trench 134 and prevent the formation of the deep and narrow trench 140, the strength of the magnetic field coming from the target 104 (FIG. 1A) may be reduced in the area of the trench 134 (e.g. the area of greater erosion). By adjusting the magnetic flux in response to variations in the erosion profile, the magnetic flux may be tuned to a radially nonuniform magnetic flux using embodiments of the present invention. The lower magnetic field in the area of the trench 134 (figuratively partially represented by dashed line 142), maintains a broad and shallow trench that will increase target utilization and maintain a more consistent magnetic field profile defining the plasma at the front side of the target.

As a result, of variations in the diameter of the substrate 120 and differences in the control and tuning of the magnetic field, the diameters of the trench 134 and the substrate 120 may differ between embodiments. For example, the diameter of the substrate 120 may be narrower than the outer or inner diameters of the trench 134 in some embodiments. In other embodiments, the diameter of the substrate 120 may be wider than the outer or inner diameters of the trench 134. Still further embodiments, may include any variation in diameters between the substrate 120 and the trench 134.

It is understood that FIG. 1B is very simply and figuratively drawn for purposes of clarity and illustration. For example, erosion profiles in other embodiments may be much more complicated, including multiple areas of comparatively greater and lesser erosion. In addition, the magnetic field profile 142 and pass through fluxes 136,138 are figurative oversimplifications for purposes of illustration, and should not be limiting. For example, magnetic field profiles and pass through fluxes in other embodiments may be much more complicated, including many areas of greater and lesser magnitude.

Figure 2:
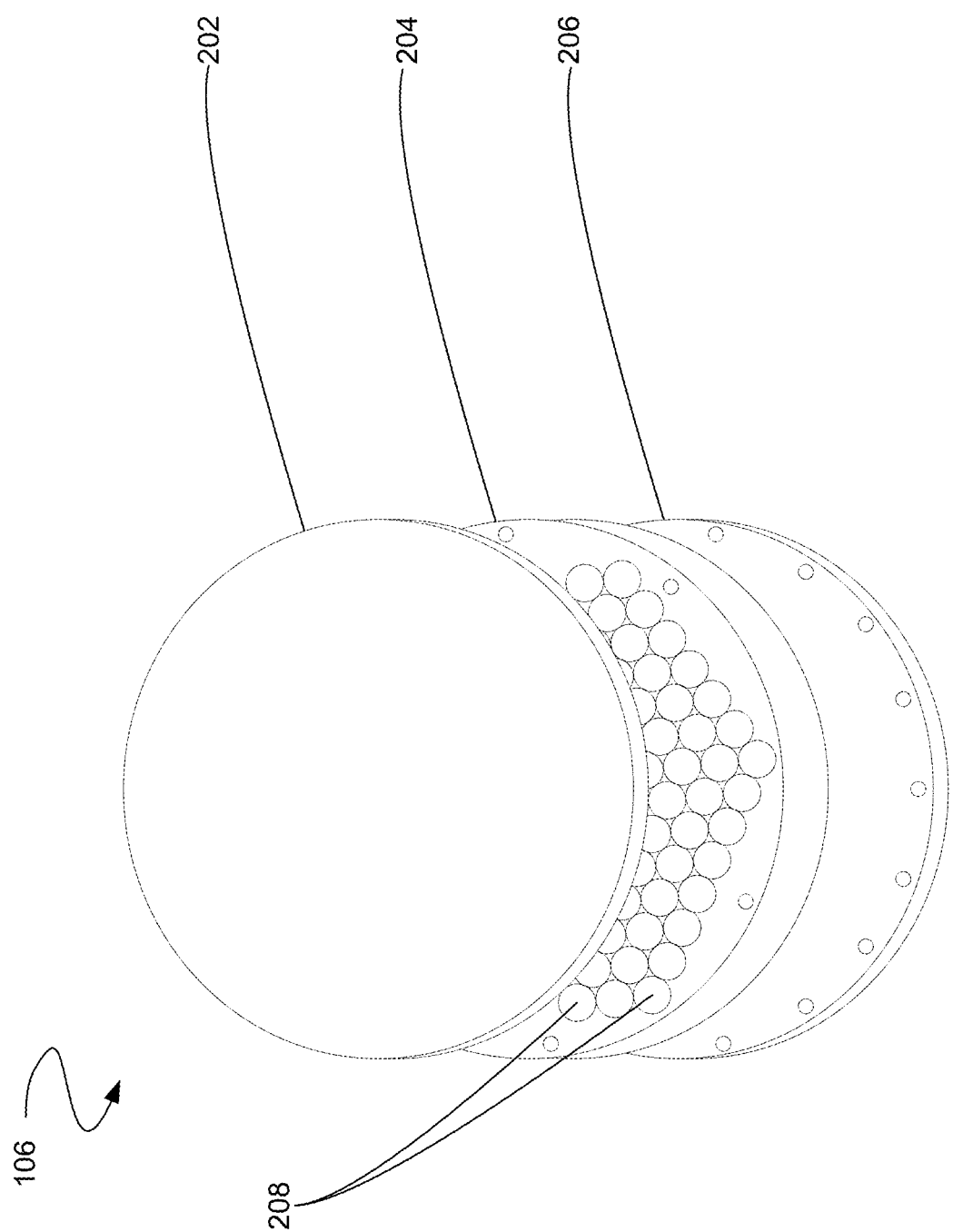
FIG. 2 is a perspective view of an exemplary programmable magnet pack, according to one aspect of the present description.

FIG. 2 is a perspective view of the programmable magnet pack 106, according to an embodiment of the present invention. In an embodiment, the main assembly stack of the programmable magnet pack 106 consists of a cover 202, a template 204, and a yoke 206.

Figure 4A:
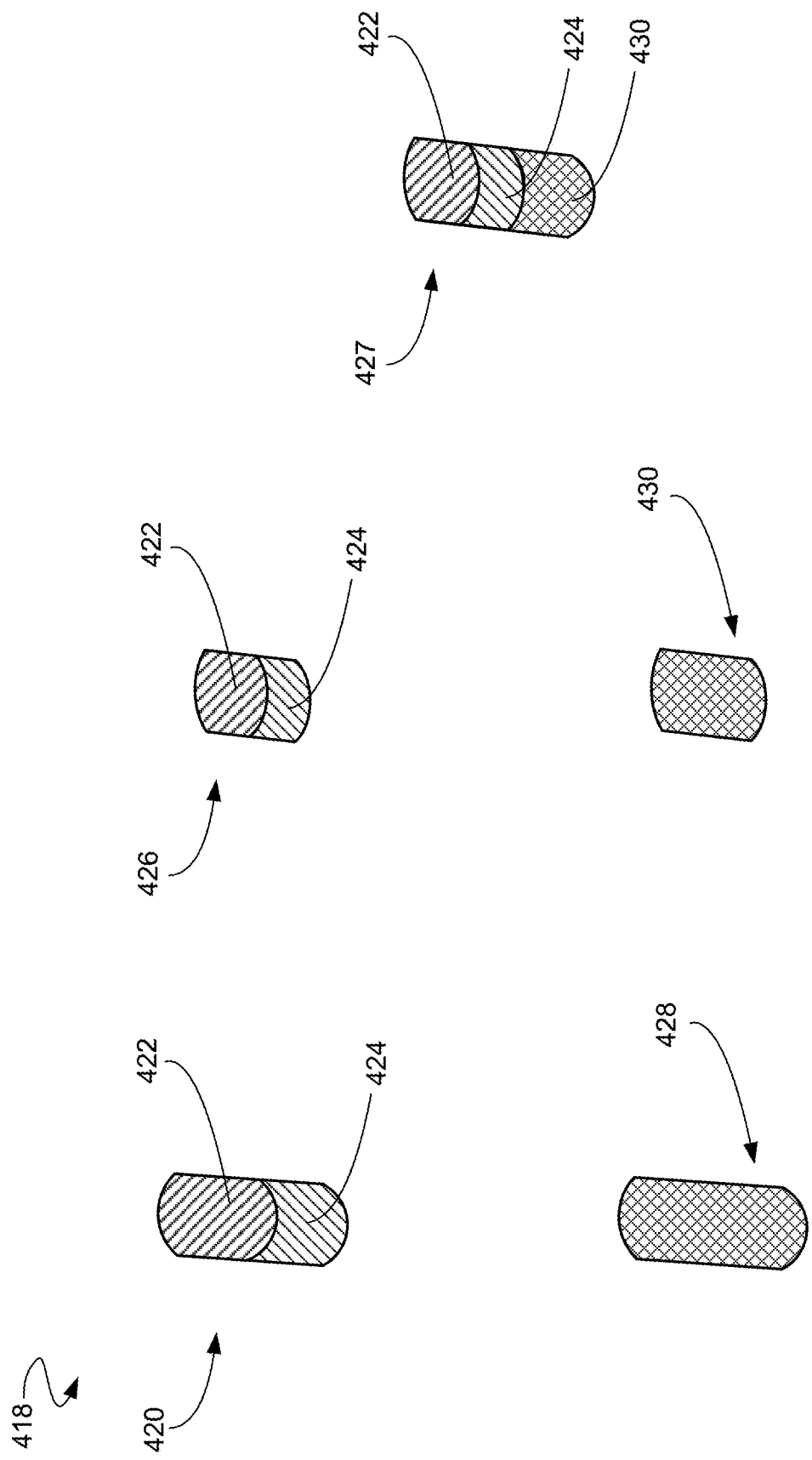
FIG. 4A is a perspective view of various inserts that may be used with a programmable magnet pack, according to one aspect of the present description.

The template 204 may include cells 208 that allow for the insertion of various removable and interchangeable inserts 418 (see FIG. 4A). In some embodiments, the template 204 may comprise such materials as, but is not limited to, Aluminum Grade 6061, Copper, or Stainless Steel Grade 300+.

The cover 202 protects the various removable and interchangeable inserts 418 (see FIG. 4A) within the cells 208 on the template 204 from damage and also allows for the various removable and interchangeable inserts 418 (see FIG. 4A) to come as close to the target 104 (FIG. 1A) as possible. In an embodiment, the cover 202 may comprise such materials as, but is not limited to, Aluminum Grade 6061, Copper, or Stainless Steel Grade 300+.

The yoke 206 provides a return path for a magnetic field that is customized or shaped by the various removable and interchangeable inserts 418 (see FIG. 4A) within the cells 208 on the template 204. In various embodiments, the yoke 206 may comprise such materials as, but is not limited to, Stainless Steel Grade 538, Stainless Steel Grade 400+, or Steel.

Figure 3:
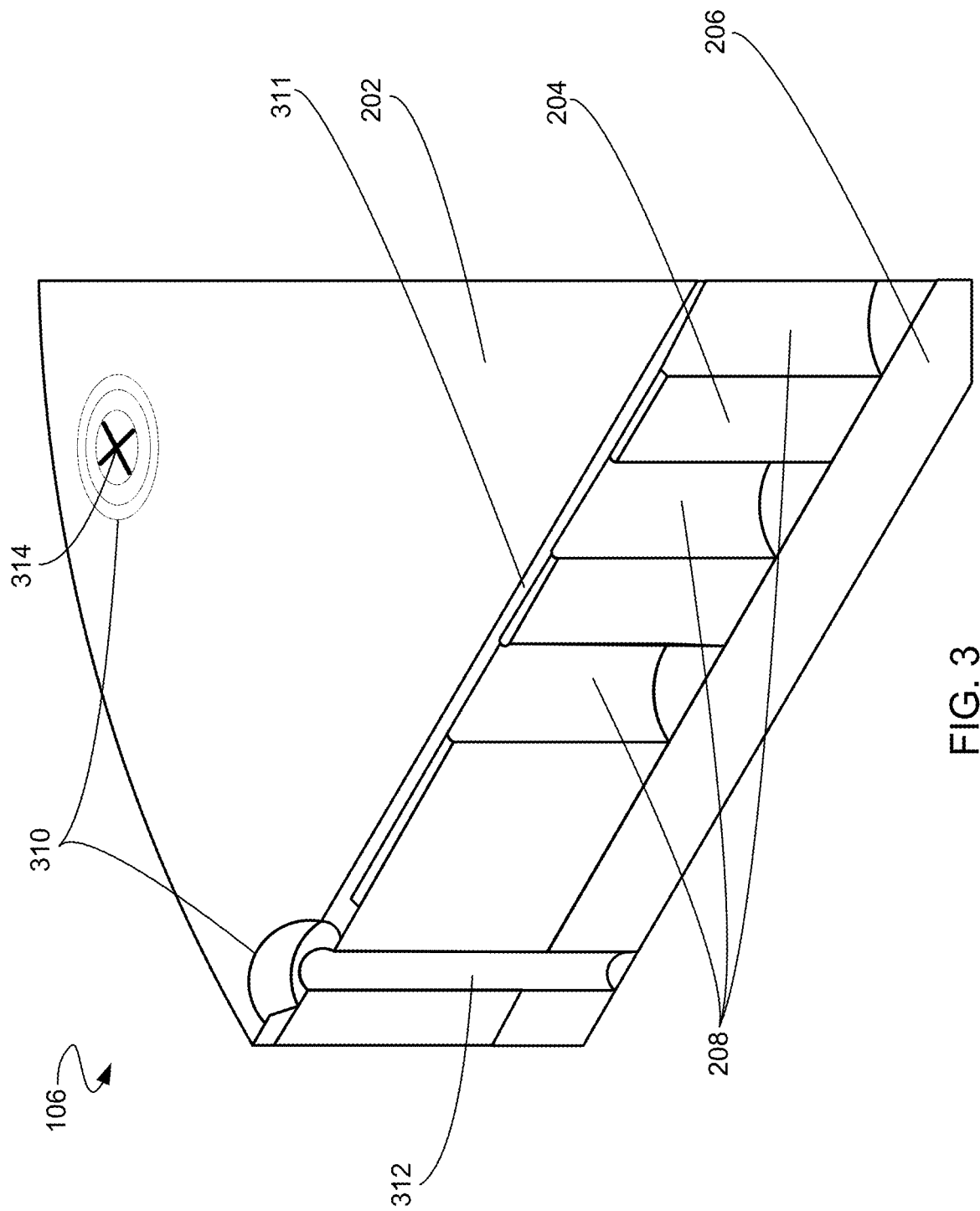
FIG. 3 is a perspective cross sectional portion of an exemplary programmable magnet pack, according to one aspect of the present description.

FIG. 3 is a perspective cross sectional view of a portion of the programmable magnet pack 106, according to an embodiment of the present invention. The programmable magnet pack 106 is depicted as partially assembled. In an embodiment, the cover 202 is removably connected to the template 204 via a fastener 314 that is inserted into a fastener hole 310 located on the cover 202. In various embodiments, a cylinder 312 may extend through the template 204 and yoke 206. The cylinder 312 allows for the fastener 314 inserted into the fastener hole 310 to extend through the template 204 and yoke 206, allowing for the cover 202, template 204, and yoke 206 to be removably connected together via the fastener 314.

In another embodiment, the various removable inserts 418 (see FIG. 4A) may be longer than the height of the cells 208 and may physically touch the cover 202 when disposed within a cell 208. The cover 202 has a reduced thickness 311 to account for any removable inserts 418 (see FIG. 4A) disposed within cells 208 that may be longer than the height of the cell 208. The reduced thickness 311 allows for the cover 202 to be removably connected to the template 204 via the fastener 314 that is inserted into the fastener hole 310 when at least one removable inserts 418 (see FIG. 4A) is longer than the height of the cell 208.

FIG. 4A is a perspective view of various removable and interchangeable inserts 418 that may be used with the programmable magnet pack, according to an embodiment of the present invention. The removable and interchangeable inserts 418 may be full length magnetic inserts 420, partial length magnetic inserts 426, full length non-magnetic inserts 428, or partial-length non-magnetic inserts 430.

The cells 208 (FIG. 3) may be divided into any number of subunits or blocks that may be filled with the magnetic and/or non-magnetic inserts. Each of the inserts may vary in length so that the strength and direction of the magnetic moment in each of the cells 208 may be tailored by adjusting the length, moment, and polar orientation of one or more inserts that may be used to fill or partially fill the length of one or more of the cells 208.

The full length magnetic inserts 420 and partial length magnetic inserts 426 may include a north pole 422 and a south pole 424. For purposes of illustration, the magnetic inserts are shown with distinct north and south poles. However, it is understood that the inserts do not have distinct north and south particles on either side and evenly divided through the middle of the insert. Instead, the north pole 422 represents the general location from which the magnetic field lines emerge, and the south pole 424 represents the general location from which the magnetic lines reenter. The full length magnetic inserts 420 and the partial length magnetic inserts 426 may comprise a permanent magnetic material, including but not limited to, Neodymium, Samaraium Cobalt, Ceramic, or Alnico. In one embodiment, the full length magnetic inserts 420 and partial length magnetic inserts 426 may comprise Rare-Earth (Neodymium) Magnet Grade N52.

The full length non-magnetic inserts 428 and the partial length non-magnetic inserts 430 may be solid and made from various materials allowing a user to shunt the magnetic field or use as a counter weight for the purpose of rotation stability, for example in embodiments where the programmable magnetic pack rotates. Full length non-magnetic inserts 428 and the partial length non-magnetic inserts 430 may comprise but are not limited to, such materials as, Stainless Steel (e.g. any grade), Aluminum, Copper, and Nylon.

Partial length non-magnetic inserts 430 and partial-length magnetic inserts 426 may be interposably stacked in a cell 208 (see FIG. 4B) on the template 204 (see FIG. 4B) to form a stacked insert 427. The stacked insert 427 may have combinations of one or more partial length non-magnetic inserts 430 or partial length magnetic inserts 426, stacked in various orders and orientations.

Thus in some embodiments, a single insert may be placed in some or all of the array slots (e.g. cells 208) to tailor (e.g. program) the magnetic field emanating from the mag pack as desired. In some embodiments, the moment of inserts may be varied from 0 (nonmagnetic) to a maximum available magnetic strength to further control the magnetic field profile, wherein the Ms may have more than one value. In some embodiments, the polarity of some inserts may be differently aligned (e.g. opposite) compared to other inserts, to further control the magnetic field profile.

In some embodiments, two half-height inserts may be used in some or all of the array slots to further control the magnetic field profile. In some embodiments, three or more inserts of different length may be used to partially or completely fill some or all of the array slots, to further control the magnetic field profile. In some embodiments, inserts with opposite, different, or no moment may be used in some or all of the array slots to further control the magnetic field profile. In various embodiments, the programmable magnet pack can provide a three dimensional array of magnets that can deliver a large range of desired magnetic field profiles to optimize magnetron sputter properties, target utilization, and defect reduction. For example, the interchangeable magnetic and non-magnetic inserts may be configured to reduce a magnetic field in thinner target areas, thereby reducing trenching of the target and maintaining sputter uniformity of the substrate. The magnetic and non-magnetic inserts may also be configured to reduce the magnetic moment at a radius (e.g. inner, outer, middle, etc.) of the trench.

In further embodiments, the programmable mag pack may be movable so that the distance between the target and the mag pack "z-height" may be adjusted as the target life is reduced, so that the target utilization and sputter rate may be further adjusted throughout the life of the target. In further embodiments the z-position of a subset of the slots, cells or inserts may be independently or individually controlled so as to further dynamically optimize the field profile as target life is reduced. In other embodiments, the mag pack cells or slots may be accessed and adjusted manually from behind the target structure without breaking vacuum in the sputter chamber.

Figure 4B:
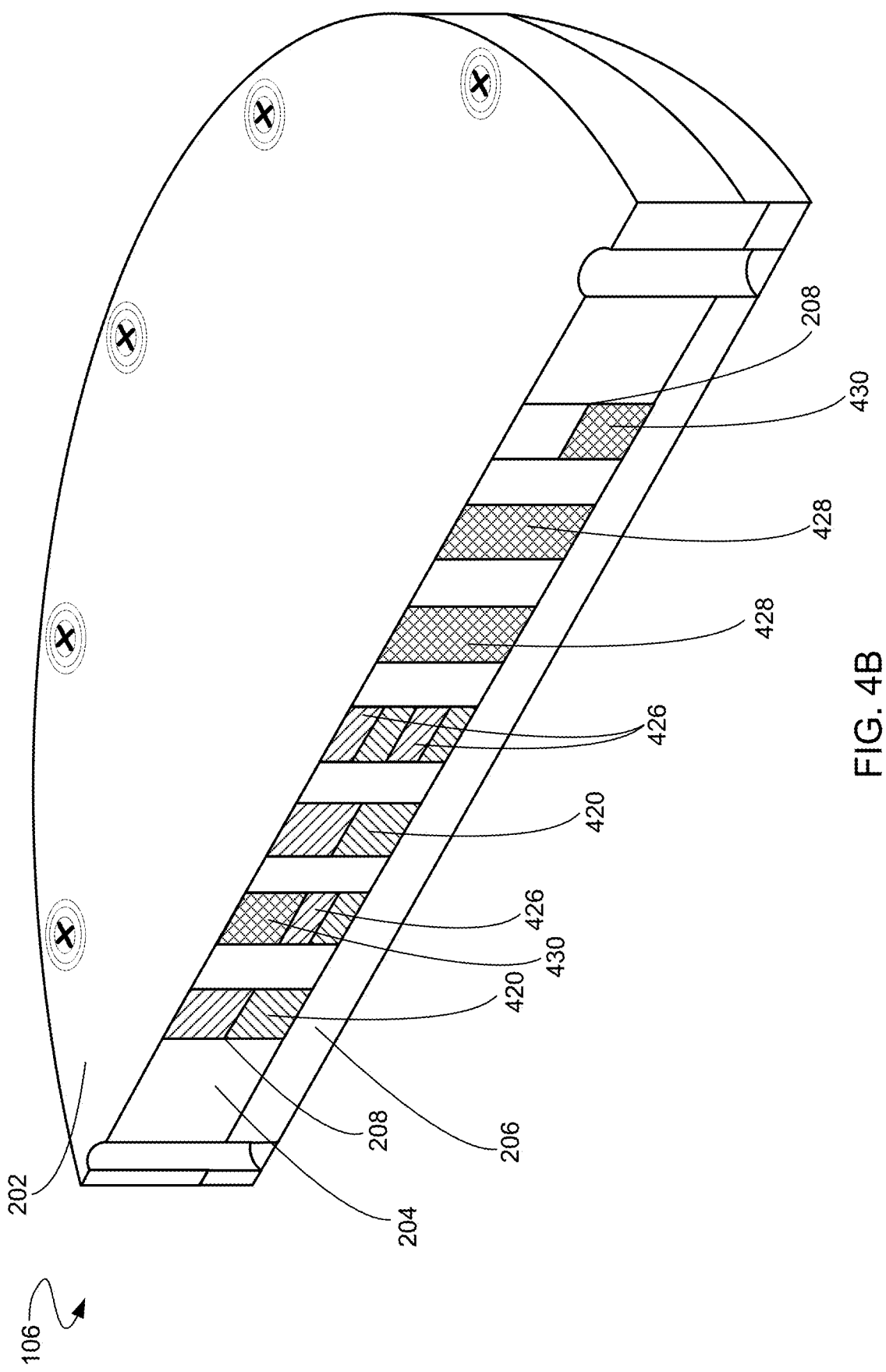
FIG. 4B is a perspective cross section of the programmable magnet pack with inserts inside cells on a template, according to one aspect of the present description.

FIG. 4B is a perspective cross sectional view of a portion of the programmable magnet pack 106 with removable and interchangeable inserts 418 (FIG. 4A) inside of cells 208 on the template 204, according to an embodiment of the present invention. The programmable magnet pack 106 is shown as assembled in this FIG. 4B.

Each full length magnetic insert 420 and each partial length magnetic insert 426 may be placed within a cell 208 with either its north pole 422 (FIG. 4A) closest to the cover 202 or its south pole 424 (FIG. 4A) closest to the cover 202. Any number of removable and interchangeable inserts 418 (FIG. 4A) may be placed in each cell 208 and variably stacked to obtain a desired erosion profile and desired sputtering performance. The maximum number of removable and interchangeable inserts 418 (FIG. 4A) placed in a cell 208 may be limited, for example, by the thickness of the template 204 and/or the length of the inserts. There are a number of possible removable and interchangeable insert arrangements 418 (FIG. 4A). For example, in one embodiment, a cell 208 may be filled with a full length magnetic insert 420 or one or more stacked partial length magnetic inserts 426 or partial length non-magnetic inserts 430. Each full length magnetic insert 420 or partial length magnetic insert 426 may have either its north pole 422 (FIG. 4A) or south pole 424 (FIG. 4A) facing the cover 202.

In another embodiment, a cell 208 may be filled with a full length non-magnetic insert 428. In another embodiment, a cell 208 may include a partial length magnetic insert 426 or partial length non-magnetic inserts 430 closest to the yoke 206, and with partial length magnetic inserts 426 and/or partial length non-magnetic inserts 430 in the remaining portion of the cell 208. In another embodiment, a cell 208 may be stacked with a partial length magnetic inserts 426 or partial length non-magnetic insert 430 closest to the cover 202, and with partial length magnetic inserts 426 and/or partial length non-magnetic inserts 430 in the remaining portion of the cell 208. In some embodiments one or more cells 208 may be empty, while one or more other cells may contain magnetic inserts and non-magnetic inserts.

The combination of one or more of the magnetic inserts, non-magnetic inserts, and empty cells is used to adjust the magnetic flux, as previously discussed. By adjusting the magnetic flux in response to variations in the erosion profile of the target, the magnetic flux may be tuned to a radially nonuniform magnetic flux. The radially nonuniform magnetic flux is therefore configured by the arrangement of the inserts within the cells to provide a substantially uniform sputter thickness. For example, the substantially uniform sputter thickness may include a sputter thickness variation of less than five percent across a substrate.

Magnetic inserts 420, 426 and non-magnetic inserts 428, 430 may also be disposed or inserted in any number of configurations inside each cell 208. Partial length magnetic and non-magnetic inserts may be of any length (e.g. ½, ⅓, ⅔, ¼, ¾, ⅕, ⅖, ⅗, ⅘, etc.) and stacked in any combination of the lengths (e.g. stacking a ⅕ with a ⅓). It should be understood that the fractional example lengths are examples and should be non-limiting. For example, various embodiments may use varying units of measurement to distinguish the magnetic and non-magnetic inserts. It should also be understood that any number of magnetic and non-magnetic inserts may be stacked within a cell, and magnetic orientations and strengths may also differ between magnetic inserts within the same cell.

Figure 5A:
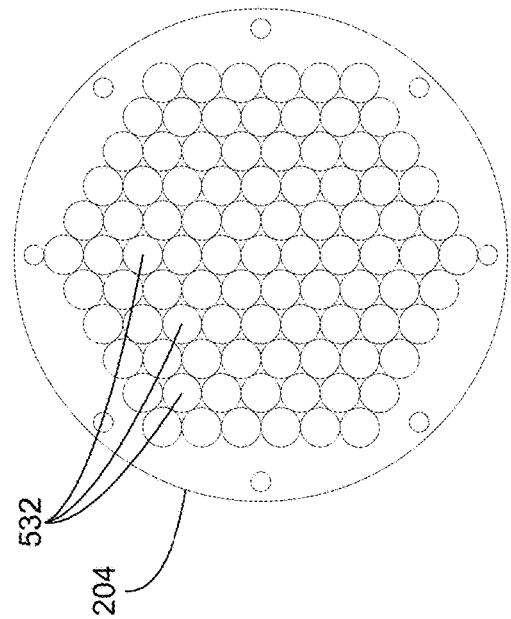
FIG. 5A depicts an exemplary template having a plurality of cells having a circular cross-section, according to one aspect of the present description.

FIG. 5A depicts an exemplary template 204 having a plurality of cells 532 having a circular cross-section, according to an embodiment of the present invention. Removable and interchangeable inserts 418 (FIG. 4A) with corresponding circular cross-sections can be placed inside of the cells 532 on the template 204. For example, magnetic inserts 420, 426 (FIG. 4A) and non-magnetic inserts 428, 430 (FIG. 4A) having a circular cross-section can be placed inside of the cells 532 on the template 204.

Figure 5B:
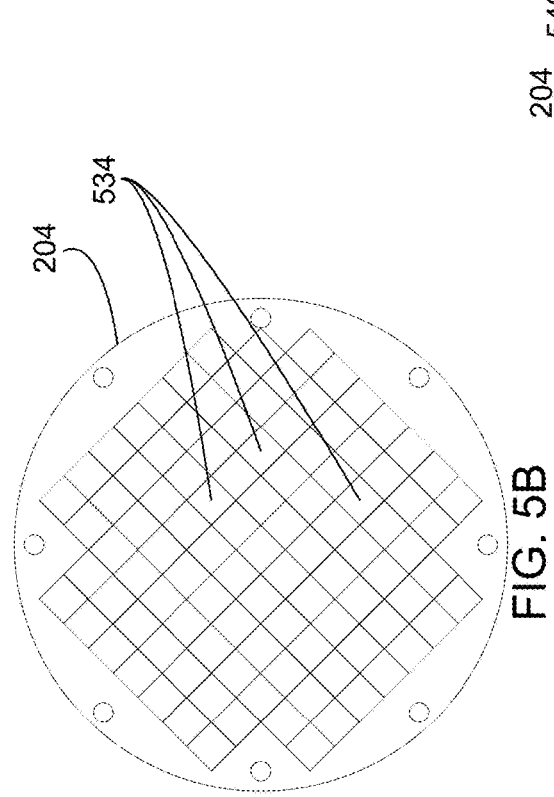
FIG. 5B depicts an exemplary template having a plurality of cells having a square cross-section, according to one aspect of the present description.

FIG. 5B depicts an exemplary template 204 having a plurality cells 534 having a square cross-section, according to an embodiment of the present invention. Removable and interchangeable inserts 418 (FIG. 4A) with corresponding square cross-sections can be placed inside of the cells 534 on the template 204. For example, magnetic inserts 420, 426 (FIG. 4A) and non-magnetic inserts 428, 430 (FIG. 4A) having a square cross-section can be placed inside of the cells 534 on the template 204.

Figure 5C:
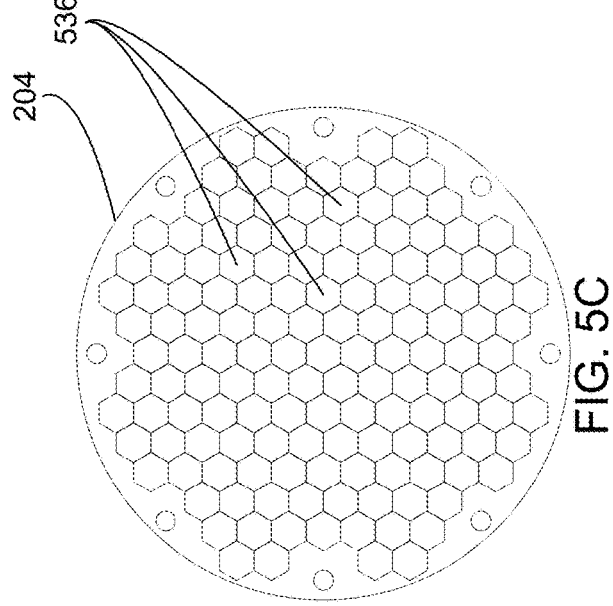
FIG. 5C depicts an exemplary template having a plurality of cells having a hexagonal cross-section, according to one aspect of the present description.

FIG. 5C depicts an exemplary template 204 having a plurality of cells 536 having a hexagonal cross-section, according to an embodiment of the present invention. Removable and interchangeable inserts 418 (FIG. 4A) with corresponding hexagonal cross-sections can be placed inside of the cells 536 on the template 204. For example, magnetic inserts 420, 426 (FIG. 4A) and non-magnetic inserts 428, 430 (FIG. 4A) having a hexagonal cross-section can be placed inside of the cells 536 on the template 204.

Figure 5D:
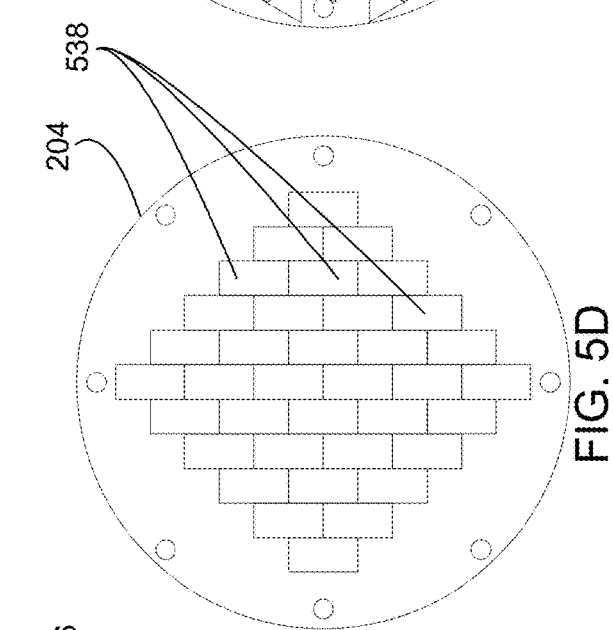
FIG. 5D depicts an exemplary template having a plurality of cells having a rectangular cross-section, according to one aspect of the present description.

FIG. 5D depicts an exemplary template 204 having a plurality of cells 538 having a rectangular cross-section, according to an embodiment of the present invention. Removable and interchangeable inserts 418 (FIG. 4A) with corresponding rectangular cross-sections can be placed inside of the cells 538 on the template 204. For example, magnetic inserts 420, 426 (FIG. 4A) and non-magnetic inserts 428, 430 (FIG. 4A) having a rectangular cross-section can be placed inside of the cells 538 on the template 204.

Figure 5E:
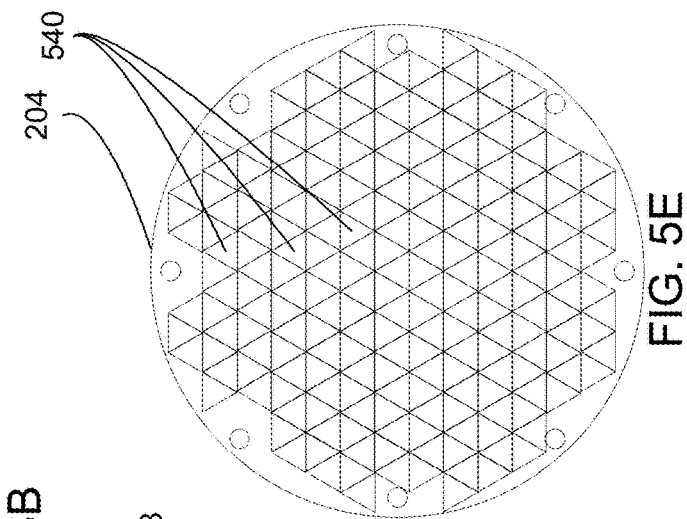
FIG. 5E depicts an exemplary template having a plurality of cells having a triangular cross-section, according to one aspect of the present description.

FIG. 5E depicts an exemplary template 204 having a plurality of cells 540 having a triangular cross-section, according to an embodiment of the present invention.

Removable and interchangeable inserts 418 (FIG. 4A) with corresponding triangular cross-sections can be placed inside of the cells 540 on the template 204. For example, magnetic inserts 420, 426 (FIG. 4A) and non-magnetic inserts 428, 430 having a triangular cross-section can be placed inside of the cells 540 on the template 204.

FIG. 6 depicts a flowchart 600 of an exemplary process of controlling a sputtering process by optimizing the positions and arrangements of magnetic and non-magnetic inserts within a magnet pack. In a block 602, a number of magnetic inserts are configured to control a pass through flux of a target based on a nonuniform erosion profile of the target. For example, in FIG. 4B magnetic inserts are arranged within cells of the template in order to control the pass through flux and erosion profile of the target, as illustrated in FIG. 1B.

In a block 604, a number of non-magnetic inserts are configured to control the pass through flux of the target based on the nonuniform erosion profile of the target. For example, in FIG. 4B non-magnetic inserts are arranged within cells of the template in order to control the pass through flux and erosion profile of the target, as illustrated in FIG. 1B.

In a block 606, the number of magnetic inserts is reconfigured to control the pass through flux of the target based on a change to the nonuniform erosion profile of the target. For example, FIGS. 2 and 3 illustrate how the magnetic inserts can be reconfigured by opening the magnet pack, reconfiguring the magnetic inserts into various combinations (as exemplified in FIG. 4B), and reassembling the magnet pack in order to control the pass through flux and erosion profile of the target, as illustrated in FIG. 1B.

In a block 608, the number of non-magnetic inserts is reconfigured to control the pass through flux of the target based on the change to the nonuniform erosion profile of the target. For example, FIGS. 2 and 3 illustrate how the non-magnetic inserts can be reconfigured by opening the magnet pack, reconfiguring the non-magnetic inserts into various combinations (as exemplified in FIG. 4B), and reassembling the magnet pack in order to control the pass through flux and erosion profile of the target, as illustrated in FIG. 1B.

In various embodiments, the target is sputtered after the configuring and after the reconfiguring. For example, FIGS. 1A and 1B illustrate a sputtering process and the shaping of the PTF in response to a nonuniform erosion profile, exemplified by the trenches. FIG. 4 further illustrates how arrangement and rearrangement of the magnetic and non-magnetic inserts might appear in various configuring and reconfiguring. It is understood that the configurations/reconfigurations of the magnetic and non-magnetic inserts is merely exemplary, and any combination, position, and/or shape may be used to adjust and tune the PTF and sputtering.

In some embodiments, the reconfiguring includes reducing the pass through flux of the target in an area greater than an outer diameter of a substrate, and in still further embodiments, the reconfiguring includes reducing the pass through flux of the target in an area of greater target erosion. For example, FIG. 1B illustrates the shaping of the PTF in response to the trenches. In addition, FIG. 1B and the corresponding description describe the variations in possible diameters between the substrate and the trenches, as caused by the location and strength of the PTF.

In various embodiments, the configuring and the reconfiguring maintains a substantially uniform sputter thickness of a substrate. For example, magnetic and non-magnetic inserts as illustrated in FIGS. 4A and 4B are positioned within cells of the programmable magnet pack in order to adjust the sputtering process illustrated in FIG. 1 to create a uniform thickness of the substrate. As sputtering causes the target to have various thickness differences, the magnetic and non-magnetic inserts are reconfigured in order to maintain uniform substrate sputter thicknesses.

In an embodiment, a nonuniform shape of the magnetic flux is maintained based on further changes to the nonuniform erosion profile of the target. For example, FIG. 1B illustrates variations in the magnetic flux caused by the differences in thickness of the target caused by nonuniform erosion during sputtering. As a result of the nonuniform erosion profile, magnetic and non-magnetic inserts are used to optimize the magnetic flux into a nonuniform shape.

While particular embodiments have been described and/or illustrated, and while these embodiments and/or examples have been described in considerable detail, they are not intended to restrict or in any way limit the scope of the concepts presented herein. Additional adaptations and/or modifications may be possible, and these adaptations and/or modifications may also be encompassed. Accordingly, departures may be made from the foregoing embodiments and/or examples without departing from the scope of the concepts presented herein. The implementations described above and other implementations are within the scope of the following claims.

What is claimed is:

1. An apparatus, comprising:
   a plurality of cells;
   a cover removably connected to the plurality of cells;
   a yoke removably connected to the plurality of cells;
   a plurality of removable magnetic inserts within the plurality of cells; and
   a plurality of removable non-magnetic inserts within the plurality of cells, wherein
   each cell of the plurality of cells includes at least one removable magnetic insert or no removable magnetic insert,
   each cell of the plurality of cells includes at least one removable non-magnetic insert or no removable non-magnetic insert,
   the plurality of removable magnetic and non-magnetic inserts are configured to provide a radially nonuniform magnetic flux between a center of a target and an outer diameter of the target, the radially nonuniform flux having a profile with variations corresponding to variations in a nonuniform erosion profile of the target.

2. The apparatus of claim 1, wherein a cell of the plurality of cells includes a number of the plurality of removable magnetic inserts or a number of the plurality of nonmagnetic inserts.

3. The apparatus of claim 1, wherein the plurality of removable magnetic inserts includes a plurality of lengths configured to control magnetic moments of cells within the plurality of cells.

4. The apparatus of claim 1, wherein the plurality of removable magnetic inserts are Neodymium, Samarium Cobalt, Ceramic, Alnico, Stainless Steel, or Steel.

5. The apparatus of claim 1 wherein the plurality of removable magnetic inserts are configured with a number of magnetic orientations within the plurality of cells.

6. The apparatus of claim 1, wherein one of the plurality of magnetic inserts and one of the plurality of nonmagnetic inserts are stacked within one of the plurality of cells.

7. The apparatus of claim 1, wherein the substantially uniform sputter thickness includes a sputter thickness variation of less than five percent across a substrate.

8. An apparatus, comprising:
- a target, wherein the target includes a nonuniform erosion profile;
- a plurality of interchangeable magnetic inserts within a plurality of cells;
- a plurality of interchangeable non-magnetic inserts within the plurality of cells, wherein:
  - each cell of the plurality of cells includes at least one interchangeable magnetic insert or no interchangeable magnetic insert,
  - each cell of the plurality of cells includes at least one interchangeable non-magnetic insert or no interchangeable non-magnetic insert,
  - the plurality of interchangeable magnetic and non-magnetic inserts are configured to provide a radially nonuniform flux having a profile with variations corresponding to variations in the nonuniform erosion profile to improve uniformity of a magnetic field profile at a front side of the target;
- a cover removably connected to the plurality of cells; and
- a yoke removably connected to the plurality of cells.

9. The apparatus of claim 8, wherein:
the plurality of interchangeable magnetic inserts comprises a full cell length magnet or a partial cell length magnet; and
the plurality of interchangeable non-magnetic inserts comprises a solid full cell length insert or a solid partial cell length insert.

10. The apparatus of claim 8, wherein the plurality of interchangeable magnetic and non-magnetic inserts are further configured to reduce the pass through flux in an area of greater target erosion.

11. The apparatus of claim 8, wherein the plurality of interchangeable magnetic and non-magnetic inserts are further configured to reduce a magnetic field in thinner target areas.

12. The apparatus of claim 8, wherein the plurality of interchangeable magnetic inserts and the plurality of interchangeable non-magnetic inserts are variably stacked in the plurality of cells.

13. The apparatus of claim 8, wherein the plurality of interchangeable magnetic inserts and the plurality of interchangeable non-magnetic inserts are further configured to reduce trenching of the target and maintain sputter uniformity of a substrate.

14. The apparatus of claim 8, wherein the nonuniform erosion profile includes a trench and the plurality of interchangeable magnetic and non-magnetic inserts are further configured to reduce a magnetic moment at a radius of the trench.

* * * * *